(12) United States Patent
Huang et al.

(10) Patent No.: US 10,401,889 B2
(45) Date of Patent: Sep. 3, 2019

(54) CURRENT GENERATOR AND METHOD OF OPERATING

(71) Applicant: TAIWAN SEMICONDUCTOR MANUFACTURING COMPANY, LTD., Hsinchu (TW)

(72) Inventors: Ming-Chieh Huang, San Jose, CA (US); Chan-Hong Chern, Palo Alto, CA (US); Chih-Chang Lin, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/989,113

(22) Filed: Jan. 6, 2016

(65) Prior Publication Data

US 2016/0116930 A1 Apr. 28, 2016

Related U.S. Application Data

(63) Continuation of application No. 14/065,460, filed on Oct. 29, 2013, now Pat. No. 9,236,799, which is a continuation of application No. 12/976,504, filed on Dec. 22, 2010, now Pat. No. 8,610,421.

(51) Int. Cl.
*G05F 1/648* (2006.01)
*G05F 1/575* (2006.01)
*G11C 5/14* (2006.01)
*H02M 3/158* (2006.01)

(52) U.S. Cl.
CPC .............. *G05F 1/648* (2013.01); *G11C 5/147* (2013.01); *H02M 3/158* (2013.01)

(58) Field of Classification Search
CPC . G05F 1/575; G05F 1/648; G05F 1/56; G05F 1/577; G05F 1/59
See application file for complete search history.

(56) References Cited

U.S. PATENT DOCUMENTS

| | | | |
|---|---|---|---|
| 3,986,101 A | 10/1976 | Koetsch et al. | |
| 4,673,866 A | 6/1987 | Masuda | |
| 5,231,316 A * | 7/1993 | Thelen, Jr. ............... | H03F 1/301 327/103 |
| 5,512,814 A * | 4/1996 | Allman .................... | G05F 3/262 323/267 |
| 5,717,323 A * | 2/1998 | Tailliet .................... | H03H 11/54 257/E27.047 |
| 6,720,754 B2 * | 4/2004 | Nakashimo ............. | G05F 1/575 323/282 |
| 7,218,168 B1 * | 5/2007 | Rahman .................... | G05F 1/56 323/273 |
| 7,279,878 B2 | 10/2007 | Otani et al. | |
| 7,619,402 B1 | 11/2009 | Kwong | |

(Continued)

*Primary Examiner* — Gary L Laxton
(74) *Attorney, Agent, or Firm* — Hauptman Ham, LLP

(57) ABSTRACT

A current generator includes an amplifier having a first terminal configured to receive a first voltage, a tunable resistance circuit coupled to an output terminal of the amplifier through a first transistor, a calibration circuit coupled to the tunable resistance circuit, and a second transistor. The second transistor includes a gate terminal coupled to the output terminal of the amplifier and a drain terminal coupled to a load. The calibration circuit is configured to adjust a resistance setting of the tunable resistance circuit.

20 Claims, 4 Drawing Sheets

(56) References Cited

U.S. PATENT DOCUMENTS

| | | |
|---|---|---|
| 7,633,333 B2 | 12/2009 | Ma |
| 7,965,065 B2 | 6/2011 | Hirota |
| 8,610,421 B2* | 12/2013 | Huang .................. G11C 5/147 |
| | | 323/297 |
| 2008/0036436 A1 | 2/2008 | Lewis |
| 2008/0136396 A1 | 6/2008 | Heilmann |
| 2009/0206886 A1* | 8/2009 | Chang .................. H04L 25/028 |
| | | 327/108 |

* cited by examiner

CURRENT GENERATOR AND METHOD OF OPERATING

PRIORITY CLAIM

The present application is a continuation of U.S. application Ser. No. 14/065,460, filed Oct. 29, 2013, which is a continuation of U.S. application Ser. No. 12/976,504, filed Dec. 22, 2010, now U.S. Pat. No. 8,610,421, issued Dec. 17, 2013, which are incorporated herein by reference in their entireties.

TECHNICAL FIELD

The present disclosure relates generally to an integrated circuit, and more particularly to a current generator.

BACKGROUND

In a memory, e.g., a Static Random Access Memory (SRAM), Process Voltage Temperature (PVT) variations may lead to leakage current variations. A current generator in the memory needs to meet a specified current range for the memory, but some current generators cannot maintain the current within the specification due to PVT variations, e.g., when the power supply voltage VDD is high and a gain of an op-amp in the current generator is low.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
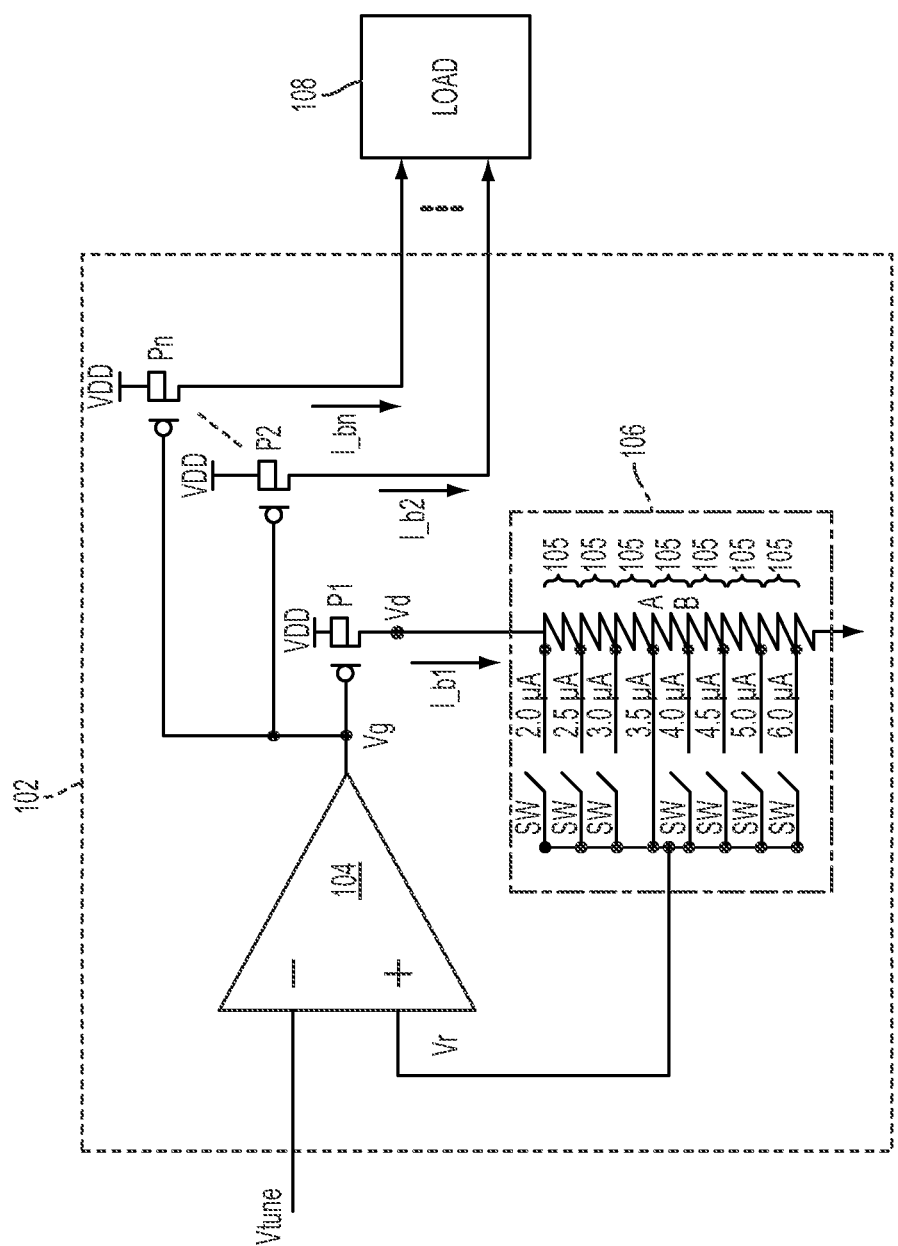
FIG. 1 is a schematic diagram showing an exemplary current generator circuit according to some embodiments.

FIG. 1 is a schematic diagram showing an exemplary current generator circuit 102 according to some embodiments. The current generator circuit 102 includes an op-amp 104, a resistance selection circuit 106, and power (PMOS) transistors P1, P2, . . . , and Pn. The input voltage Vtune coupled to a negative terminal of the op-amp 104 is set to control a bias current I_b1 through the resistance selection circuit 106. The positive terminal of the op-amp 104 is coupled to the resistance selection circuit 106. The resistance value of the resistance selection circuit 106 is adjusted to provide the desired current I_b1 for a given Vtune. The resistance selection circuit 106 includes tunable resistor sections 105 coupled in series to provide a target current range for I_b1, e.g., 2-6 µA.

For example, one or more of the switches SW in the resistance selection circuit 106 is closed (or opened) in accordance with Vtune to select the respective one or more tunable resistor sections 105 that provide a desired resistance value corresponding to the target current range for I_b1. The selected resistor section(s) 105 is/are further tunable to vary its resistance value in response to, e.g., power supply variations, as will be described herein below. Thus, by providing resistance selection circuit 106 in which resistor sections 105 are not only selectable (e.g., by respective switches SW and in accordance with Vtune) but also tunable (e.g., by a tunable resistor circuit 200/300 as will be described herein below and in response to power/PVT variations), stable output currents (e.g., I_b1, I_b2, I_bn) can be obtained while suppressing undesired effects caused by the power/PVT variations.

The power transistors P1, P2, . . . , and Pn are configured to be operating in a saturation mode. For example, the gate voltage Vg of the power transistor P1 is lower than a power supply voltage (VDD) minus a threshold voltage (Vth) of the power transistor P1. The drain voltage Vd of the power transistor P1 is lower than a certain voltage so that the source-drain voltage drop $V_{DS}$ is higher than the source-gate voltage drop $V_{GS}$ minus Vth for a saturation mode. The design (e.g., size) of the power transistors (e.g., P1, P2, . . . , and Pn) and resistance values of tunable resistor sections 105 depend on the specific load 108 (i.e., specific applications) and the desired current range of I_b1. Because the power transistors P1, P2, . . . , and Pn are operating in the saturation mode, the currents I_b1, I_b2, I_bn can be controlled at a relatively stable value. In particular, if the power transistors P1, P2, . . . , and Pn have similar characteristics (e.g., similar I-V curves), the currents I_b1, I_b2, . . . , I_bn will be similar, because they share the same gate-source voltage $V_{GS}$.

Figure 2:
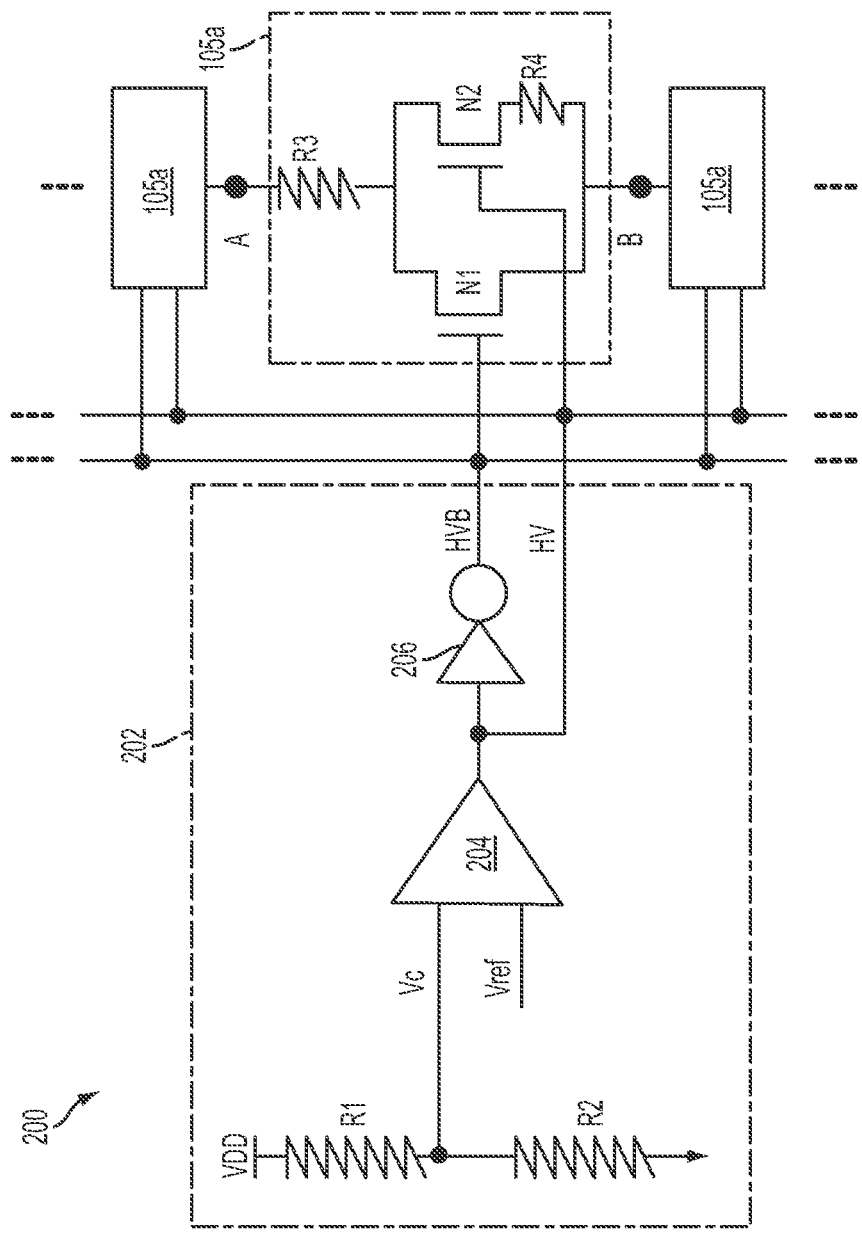
FIG. 2 is a schematic diagram showing an exemplary tunable resistor circuit for the current generator circuit in FIG. 1 according to some embodiments.

FIG. 2 is a schematic diagram showing an exemplary tunable resistor circuit for the current generator circuit in FIG. 1 according to some embodiments. The tunable resistor circuit 200 includes an exemplary tunable resistor section 105a for the tunable resistor section 105 in FIG. 1. For example, the tunable resistor circuit 200 includes a resistor calibration circuit 202 that is coupled to multiple tunable resistor sections 105a in the resistance selection circuit 106. Each tunable resistor section 105a has the same structure as the resistor section 105a between nodes A and B shown in more detail.

A comparator 204 in the resistor calibration circuit 202 receives a reference voltage Vref. The power supply voltage VDD is divided by resistors R1 and R2 to provide a portion of VDD, i.e., Vc, to the comparator 204. The comparator determines whether Vc is higher or lower than Vref by comparing Vc and Vref.

If Vc is higher than Vref (i.e., if VDD is higher than expected), the comparator 204 provides a logical 1 to the inverter 206 and HV. The logical 1 at HV turns on an NMOS transistor N2. The inverter 206 provides a logical 0 to HVB to turn off the NMOS transistor N1. As a result, the resistance between nodes A and B is the sum of resistance R3 and R4 that are now connected in series. The NMOS transistors N1 and N2 function as switches for different resistors coupled in parallel (in this example, no resistor for NMOS transistor N1 and a resistor R4 for NMOS transistor N2).

On the other hand, if Vc is lower than Vref (i.e., if VDD is not higher than expected), the comparator 204 provides a logical 0 to the inverter 206 and HV. The logical 0 at HV turns off the NMOS transistor N2. The inverter 206 provides a logical 1 to HVB to turn on the NMOS transistor N1. As a result, the resistance between nodes A and B is the resistance R3 only.

The signals HVB and HV are coupled to all tunable resistor sections 105a. Thus, the tunable resistor circuit 200 controls each resistor section 105a to have a higher resistance when VDD is higher. By providing a higher resistance for a higher VDD, there is no need to decrease Vtune in FIG. 1 when the resistance selection circuit 106 has a lower than expected resistance due to PVT variations. Even though two signals, e.g., HVB and HV, are used in this example, any number of control signals or control signal bits can be used for the control of various numbers of resistors.

Without the tunable resistor circuit 200, Vtune may need to be decreased for a lower resistance of the resistance selection circuit 106 due to PVT variations, in order to try to maintain I_1 at a specified value. This in turn can cause a lower gain of the op-amp 104 under higher VDD, because some device in the op-amp 104 can operate at a linear mode (instead of a saturated mode) due to the higher VDD and lower Vtune. The lower gain of the op-amp 104 can cause the current I_b1 to deviate from the specified current range. For example, the I_b1 can be higher because of the lower gain at higher VDD. In one example, a current generator circuit without the tunable resistor circuit 200, its output current with a setting of 2 µA exhibited 2.73 µA under PVT variations (various process corners at temperature of −40 to 125° C. with a power supply voltage of 0.765-0.935 V). In comparison, for a current generator circuit with the tunable resistor circuit 200, its output current with a setting of 2 µA exhibited 2.28 µA under the same PVT variations.

Therefore, by utilizing the tunable resistor circuit 200 in the current generator circuit 102 in FIG. 1, a relatively stable current/voltage can be specified over a wide range without being significantly affected by PVT variations, because the op-amp 104 operates normally, even under a higher VDD. In one application, the current generator circuit 102 utilizing the tunable resistor circuit 200 can be implemented in a SRAM array to provide a constant current/voltage and thus control the SRAM's leakage current.

Figure 3:
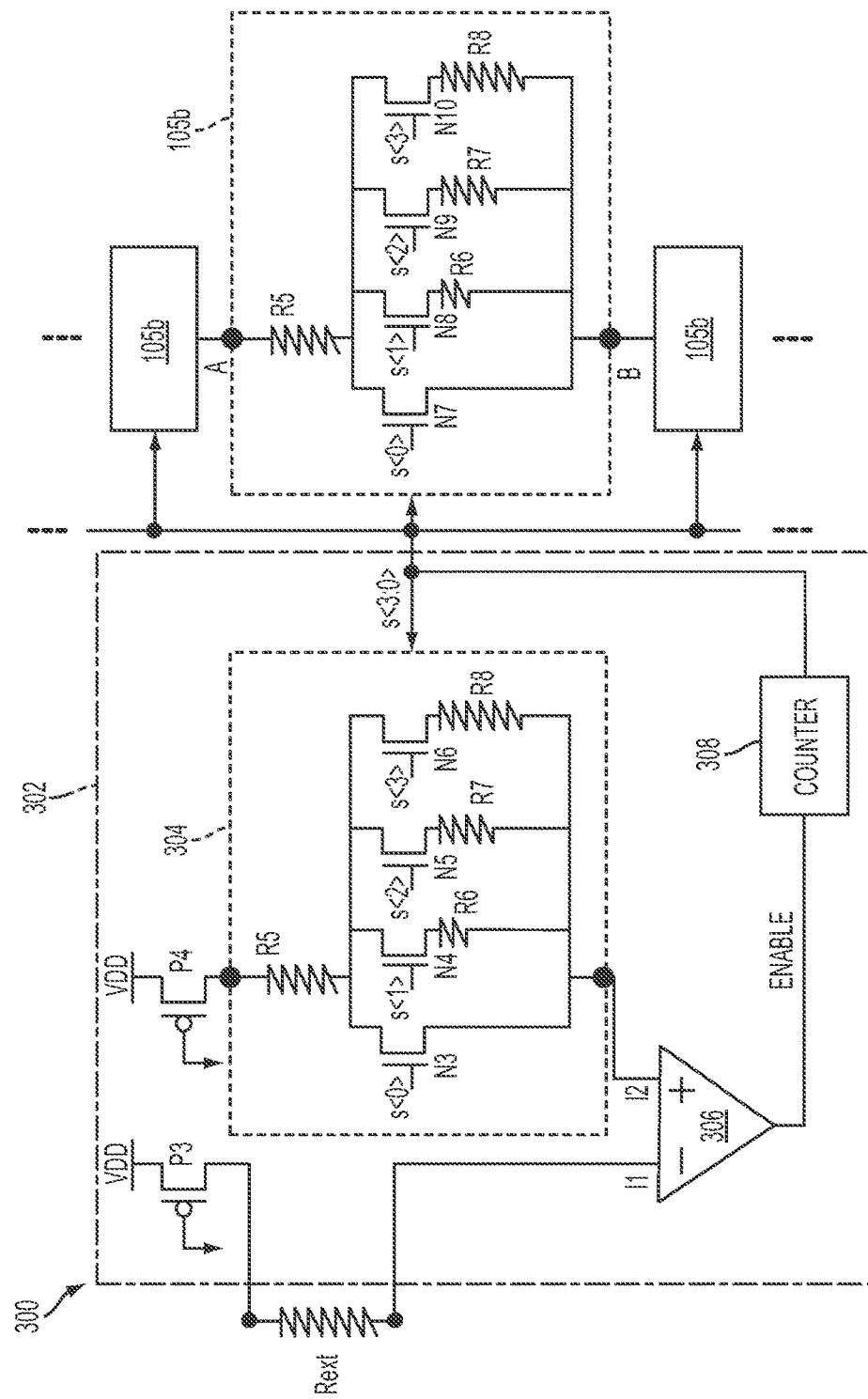
FIG. 3 is a schematic diagram showing another exemplary tunable resistor circuit for the current generator circuit in FIG. 1 according to some embodiments.

FIG. 3 is a schematic diagram showing another exemplary tunable resistor circuit for the current generator circuit in FIG. 1 according to some embodiments. The tunable resistor circuit 300 includes another exemplary tunable resistor section 105b for tunable resistor sections 105 in FIG. 1. For example, the tunable resistor circuit 300 includes a resistor calibration circuit 302 that is coupled to multiple tunable resistor sections 105b in the resistance selection circuit 106. Each resistor section 105b has the same structure as the resistor section 105b between nodes A and B shown in more detail.

The resistor calibration circuit 302 calibrates the resistance of the resistor section 105b by utilizing an external reference resistor Rext and an (internal) calibration resistor section 304. (The external reference resistor Rext can be replaced by a relatively reliable internal resistor in another embodiment.) The calibration resistor section 304 has the same structure as the resistor section 105b. The Rext is coupled to a power transistor P3 and the calibration resistor section 304 is coupled to a power transistor P4. The currents I1 and I2, from Rext and the calibration resistor section 304 respectively, are compared in a comparator 306.

If the Rext is greater than the resistance of the calibration resistor section 304, then I1 is less than I2, and the comparator output is a logical 1 that enables a counter 308 to count up. The counter 308 is programmed to supply a control signal, e.g., s<3:0>. The control signal s<3:0> is supplied to NMOS transistors N3, N4, N5, and N6, as s<0>, s<1>, s<2>, and s<3>, respectively. In one embodiment, the control signal s<3:0> has only one bit that has a logical 1, turning on only one NMOS transistor among NMOS transistors N3, N4, N5, and N6, thus connecting one resistor value to R5 (in series) among different resistance values, e.g., no resistance, R6, R7, or R8 (in order of increasing resistance value).

The value of s<3:0> is increased until the current I1 is greater than the current I2. Then the comparator 306 supplies a logical 0 output that disables the counter 308, thus the counter 308 stops counting. The final s<3:0> value is used as the resistor calibration result and supplied to all tunable resistor sections 105b. Because the calibration resistor section 304 is located physically close to the tunable resistor sections 105b (e.g., in the same IC package or on the same PCB), the calibration resistor section 304 can closely follow the local PVT variations and calibrate resistor values accordingly. Even though a 4-bit control signal, e.g., s<3:0>, is used in this example, any number of bits can be used as the control signal for various numbers of resistors.

Figure 4:
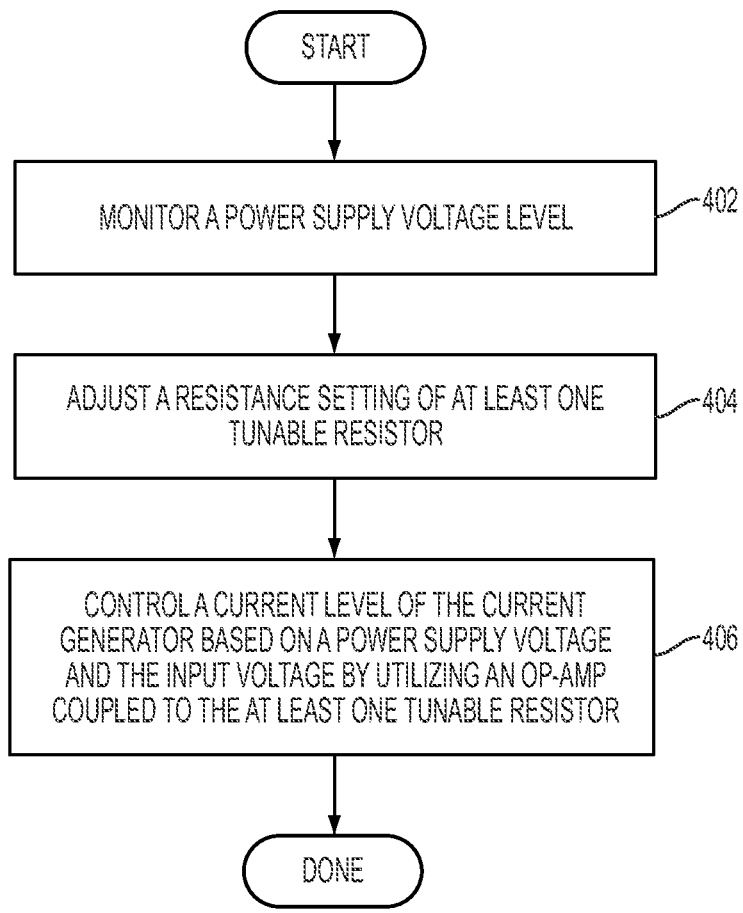
FIG. 4 is a flowchart of a method for the exemplary current generator circuit in FIG. 1 according to some embodiments.

FIG. 4 is a flowchart of a method for the exemplary current generator circuit in FIG. 1 according to some embodiments. At step 402, an input voltage, e.g., Vtune, is received. At step 404, one or more from at least one tunable resistor, e.g., 105, 105a, or 105b, is selected by a resistance selection circuit, e.g., 106. At step 406, a power supply voltage, e.g., VDD in FIG. 2, or a current of a reference resistor, e.g., I1 in FIG. 3, is monitored. At step 408, a resistance setting of the at least one tunable resistor is adjusted. At step 410, an output current, e.g., I_b1, I_b2, . . . , I_bn, is supplied utilizing an op-amp, e.g., 104, based on the input voltage, e.g., Vtune.

In various embodiments, a gate of at least one power transistor, e.g., P1, P2, . . . , Pn, is coupled to an output of the op-amp. A drain of the at least one power transistor is coupled to the at least one tunable resistor, e.g., 105, or a load, e.g., 108. A negative terminal of the op-amp, e.g., 104, is coupled to an input voltage, e.g., Vtune. A positive terminal of the op-amp, e.g., 104, is coupled to the at least one tunable resistor, e.g., 105. A node of the at least one tunable resistor is selected for coupling from the positive terminal of the op-amp to the at least one tunable resistor, e.g., using a resistance selection circuit 106. The at least one tunable resistor is controlled by a resistor calibration circuit, e.g., 202 or 302, coupled to the at least one tunable resistor.

In various embodiments, monitoring a power supply voltage is performed by comparing at least a portion of the power supply voltage and a reference voltage, e.g., Vref. In other embodiments, the current of the reference resistor, e.g., Rext, is compared with a current flowing in an internal calibration resistor section, e.g., 304. The internal calibration resistor section, e.g., 304, has the same structure as one tunable resistor, e.g., 105b, of the at least one tunable resistor. Adjusting at least one tunable resistor includes selecting one resistor value among multiple resistor values in each of the at least one tunable resistor.

One aspect of this description relates to a current generator. The current generator includes an amplifier having a first terminal configured to receive a first voltage, a tunable resistance circuit coupled to an output terminal of the amplifier through a first transistor, a calibration circuit coupled to the tunable resistance circuit, and a second transistor. The second transistor includes a first terminal coupled to the output terminal of the amplifier and a second terminal coupled to a load. The calibration circuit is configured to adjust a resistance setting of the tunable resistance circuit.

Another aspect of this description relates to a method of operating a current generator. The method includes receiving an input voltage, selecting a resistance circuit of a plurality of resistance circuits in accordance with the input voltage, outputting a current in accordance with the selected resistance circuit of the plurality of resistance circuits to a gate terminal of a first transistor and a gate terminal of a second transistor, and adjusting a resistance value of the selected resistance circuit of the plurality of resistance circuits.

Still another aspect of this description relates to a current generator. The current generator includes an amplifier having a first terminal configured to receive an input voltage, a tunable resistance circuit coupled to a second terminal of the amplifier, a transistor having a gate terminal coupled to a third terminal of the amplifier and a drain terminal coupled to the tunable resistance circuit, and a calibration circuit comprising a counter. The calibration circuit is coupled to the tunable resistance circuit, and is configured to adjust a resistance setting of the tunable resistance circuits.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A current generator, comprising:
   an amplifier having an inverting input terminal configured to receive a first voltage and a non-inverting input terminal configured to receive a feedback voltage;
   a tunable resistance circuit coupled to an output terminal of the amplifier through a first transistor, the tunable resistance circuit comprising a first portion configured as a feedback path from the first transistor to the non-inverting input terminal and a second portion coupled between the non-inverting input terminal and a ground;
   a calibration circuit coupled to the tunable resistance circuit; and
   a second transistor, wherein a first terminal of the second transistor is coupled to the output terminal of the amplifier, and a second terminal of the second transistor is coupled to a load,
   wherein the calibration circuit is configured to
      monitor a power supply voltage or a current of a reference resistance,
      adjust a value of the feedback voltage by adjusting a resistance setting of the first portion based on the monitored voltage or current and a resistance setting of the second portion based on the monitored voltage or current.

2. The current generator of claim 1, wherein the first transistor and the second transistor are coupled to a power supply having the power supply voltage, and configured to be operated in a saturation mode.

3. The current generator of claim 1, wherein the calibration circuit comprises a comparator configured to:
   receive a reference voltage and a second voltage, and
   output a compared result.

4. The current generator of claim 3, wherein the second voltage corresponds to a portion of the power supply voltage.

5. The current generator of claim 3, wherein the tunable resistance circuit comprises a plurality of switches configured to adjust the resistance setting of the first portion and the resistance setting of the second portion according to the compared result.

6. The current generator of claim 5, wherein each of the resistance setting of the first portion and the resistance setting of the second portion comprises:
   a first resistance value corresponding to the second voltage being greater than the reference voltage; and
   a second resistance value corresponding to the second voltage being less than the reference voltage, the first resistance value being greater than the second resistance value.

7. The current generator of claim 5, wherein
   the calibration circuit comprises an inverter configured to output a signal inverted from the compared result,
   the plurality of switches is a first plurality of switches, and
   the tunable resistance circuit comprises a second plurality of switches configured to adjust the resistance setting of the first portion and the resistance setting of the second portion according to the signal.

8. The current generator of claim 1, wherein the calibration circuit comprises a comparator comprising:
   a first input terminal coupled to the reference resistance;
   a second input terminal coupled to a calibration resistance section; and
   an output terminal coupled to a counter configured to count according to an output of the comparator.

9. The current generator of claim 8, wherein the calibration circuit further comprises:
   a third transistor having a first terminal coupled to a power supply, and a second terminal coupled to the reference resistance; and
   a fourth transistor having a first terminal coupled to the power supply, and a second terminal coupled to the calibration resistance section.

10. A method of operating a current generator, the method comprising:
    receiving an input voltage;
    selecting an adjustable resistance circuit of a plurality of adjustable resistance circuits in accordance with the input voltage, the plurality of adjustable resistance circuits being configured in series between a first transistor and a ground;
    outputting a current in accordance with the selected adjustable resistance circuit of the plurality of adjustable resistance circuits, the current having a value based on a voltage at a gate terminal of the first transistor and a gate terminal of a second transistor; and adjusting a resistance value of each adjustable resistance circuit of the plurality of adjustable resistance circuits, the adjusting the resistance value being based on monitoring a power supply voltage or a current of a reference resistance and comprising selecting between alternative current paths in each adjustable resistance circuit.

11. The method of claim 10 wherein monitoring the power supply voltage comprises comparing a portion of the power supply voltage with a reference voltage.

12. The method of claim 10 wherein monitoring the current of the reference resistance comprises comparing the current flowing through the reference resistance with a current flowing through a calibration resistance section.

13. The method of claim 10, wherein adjusting the resistance value of each adjustable resistance circuit of the plurality of resistance circuits further comprises:

adjusting a resistance value of a calibration resistance section according to a comparison result of a current flowing through the reference resistance and a current flowing through the calibration resistance section.

14. The method of claim 11, wherein adjusting the resistance value of each adjustable resistance circuit of the plurality of adjustable resistance circuits comprises:

setting a first resistance value of each adjustable resistance circuit of the plurality of adjustable resistance circuits, the first resistance value corresponding to the portion of the power supply voltage being greater than the reference voltage; or setting a second resistance value of each adjustable resistance circuit of the plurality of adjustable resistance circuits, the second resistance value corresponding to the portion of the power supply voltage being less than the reference voltage, and the first resistance value being greater than the second.

15. A current generator, comprising:

an amplifier having an inverting input terminal configured to receive an input voltage;

a tunable resistance circuit coupled to a non-inverting input terminal of the amplifier;

a first transistor, wherein a gate terminal of the first transistor is coupled to an output terminal of the amplifier, and a drain terminal of the first transistor is coupled to the tunable resistance circuit so that a current flows through the first transistor and the tunable resistance circuit; and a calibration circuit comprising a counter, wherein the calibration circuit is coupled to the tunable resistance circuit, and is configured to monitor a power supply voltage or a current of a reference resistance, based on the monitored voltage or current, adjust a resistance of a first portion of the tunable resistance circuit, the first portion being configured as a feedback path to the non-inverting input terminal of the amplifier from the drain terminal of the first transistor, and based on the monitored voltage or current, adjust a resistance of a second portion of the tunable resistance circuit coupled between the non-inverting input terminal of the amplifier and a ground.

16. The current generator of claim 15, wherein the calibration circuit further comprises a comparator comprising:

a first input terminal coupled to a power supply through a reference resistance;

a second input terminal coupled to the power supply through a calibration resistance section; and an output terminal coupled to the counter.

17. The current generator of claim 16, wherein the tunable resistance circuit comprises:

a second transistor;

a third transistor, a drain terminal of the third transistor being coupled to a drain terminal of the second transistor; and a resistance circuit, a first terminal of the resistance circuit being coupled to a source terminal of the second transistor, and a second terminal of the resistance circuit being coupled to a source terminal of the third transistor.

18. The current generator of claim 16, wherein the counter is configured to supply a control signal configured to adjust an equivalent resistance value of the tunable resistance circuit or an equivalent resistance value of the calibration resistance section.

19. The current generator of claim 16, wherein the tunable resistance circuit comprises:

a second transistor;

a third transistor, a drain terminal of the third transistor being coupled to a drain terminal of the second transistor;

a first resistance circuit, a first terminal of the resistance circuit being coupled to a source terminal of the second transistor; and a second resistance circuit, a first terminal of the second resistance circuit being coupled to a source terminal of the third transistor, and a second terminal of the first resistance circuit being coupled to a second terminal of the second resistance circuit.

20. The current generator of claim 16, wherein the tunable resistance circuit comprises a plurality of tunable resistance sections, and at least one of the plurality of tunable resistance sections has a same structure as the calibration resistance section.

* * * * *